(12) United States Patent
Lee et al.

(10) Patent No.: US 9,293,489 B2
(45) Date of Patent: Mar. 22, 2016

(54) CMOS IMAGE SENSOR

(71) Applicant: SAMSUNG ELECTRONICS CO., LTD., Suwon-Si, Gyeonggi-Do (KR)

(72) Inventors: Myungwon Lee, Hwaseong-Si (KR); Sangchul Sul, Suwon-Si (KR); Hirosige Goto, Suwon-Si (KR); Sae-Young Kim, Yongin-Si (KR); Kang-Su Lee, Daegu (KR); Gwideokryan Lee, Suwon-Si (KR); Masaru Ishii, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/315,730

(22) Filed: Jun. 26, 2014

(65) Prior Publication Data
US 2015/0001663 A1    Jan. 1, 2015

(30) Foreign Application Priority Data
Jul. 1, 2013    (KR) .......................... 10-2013-0076598

(51) Int. Cl.
*H01L 27/146*    (2006.01)

(52) U.S. Cl.
CPC ...... *H01L 27/14621* (2013.01); *H01L 27/1463* (2013.01); *H01L 27/1464* (2013.01); *H01L 27/14627* (2013.01)

(58) Field of Classification Search
CPC ................................................ H01L 27/14636
USPC ............................................................ 257/432
See application file for complete search history.

(56) References Cited

U.S. PATENT DOCUMENTS

| 7,952,156 | B2  |   | 5/2011  | Mitsui et al.    |         |
|-----------|-----|---|---------|------------------|---------|
| 7,999,339 | B2  |   | 8/2011  | Yokoyama         |         |
| 2007/0114629 | A1 | * | 5/2007  | Dosluoglu et al. | 257/435 |
| 2009/0061217 | A1 | * | 3/2009  | Silva et al.     | 428/336 |
| 2011/0272772 | A1 | * | 11/2011 | Kokubun          | 257/432 |
| 2014/0029104 | A1 | * | 1/2014  | Guo et al.       | 359/585 |

FOREIGN PATENT DOCUMENTS

| JP | 2011-249623 A     | 12/2011 |
| JP | 2012-114197 A     | 6/2012  |
| JP | 2012-164892       | 8/2012  |
| KR | 1020110052256 A   | 5/2011  |
| KR | 1020120103912 A   | 9/2012  |

* cited by examiner

*Primary Examiner* — Edward Wojciechowicz
(74) *Attorney, Agent, or Firm* — Volentine & Whitt, PLLC

(57) ABSTRACT

An image sensor includes a semiconductor substrate, a storage node region in the semiconductor substrate, an insulating portion on the semiconductor substrate, a via contact extending through the insulating portion, a photo-electric converter in the semiconductor substrate and spaced apart from the storage node region, an organic photo-electric layer on the insulating portion, and a buffer interposed between and electrically connecting the via contact and the storage node region.

4 Claims, 16 Drawing Sheets

CMOS IMAGE SENSOR

PRIORITY STATEMENT

This U.S. non-provisional patent application claims priority under 35 U.S.C. §119 to Korean Patent Application No. 10-2013-0076598, filed on Jul. 1, 2013, in the Korean Intellectual Property Office, the entire contents of which are hereby incorporated by reference.

BACKGROUND

The inventive concept relates to a CMOS image sensor.

Image sensors are semiconductor devices capable of converting optical images into electric signals. Such image sensors may be classified into various types, including charge coupled device (CCD) and complementary metal oxide semiconductor (CMOS) types of image sensors. A CMOS image sensor (CIS) includes a two-dimensional array of pixels. Each of the pixels includes a photodiode (PD), which converts incident light into an electric signal.

SUMMARY

According to one aspect of the inventive concept, there is provided an image sensor including a semiconductor substrate, a storage node region in the semiconductor substrate, a photo-electric converter in the semiconductor substrate and spaced apart from the storage node region, an insulating portion disposed on the semiconductor substrate, a via contact adjacent to the storage node region and extending through the insulating portion, an organic photo-electric layer disposed on the insulating portion, and a buffer interposed between the via contact and the storage node region and electrically connecting the via contact to the storage node region.

According to another aspect of the inventive concept, there is provided an image sensor including a semiconductor substrate a contact hole extending vertically therein between its first and second opposite major surfaces, a photo-electric converter in the semiconductor substrate, a storage node region spaced apart from the photo-electric converter and located in the semiconductor substrate adjacent to the first surface, an insulating layer disposed on the second surface of the semiconductor substrate, a via contact in the contact hole of the semiconductor substrate, an organic photo-electric layer on the insulating layer, and a buffer interposed between the storage node region and the via contact and electrically connecting the storage node region to the via contact.

According to still another aspect of the inventive concept, there is provided an image sensor including a photo-electric converter disposed in a semiconductor substrate, a storage node comprising a doped region of the semiconductor substrate spaced from the photo-electric converter, a via contact electrically connected to the organic photo-electric layer; and a buffer interposed between the via contact and the storage node and electrically connecting the via contact to the storage node, and in which the buffer is of material having a work function between that of semiconducting material of the semiconductor substrate and material of the via contact.

BRIEF DESCRIPTION OF THE DRAWINGS

The inventive concept will be more clearly understood from the following brief description of preferred embodiment made in conjunction with the accompanying drawings.

DETAILED DESCRIPTION

Figure 1:
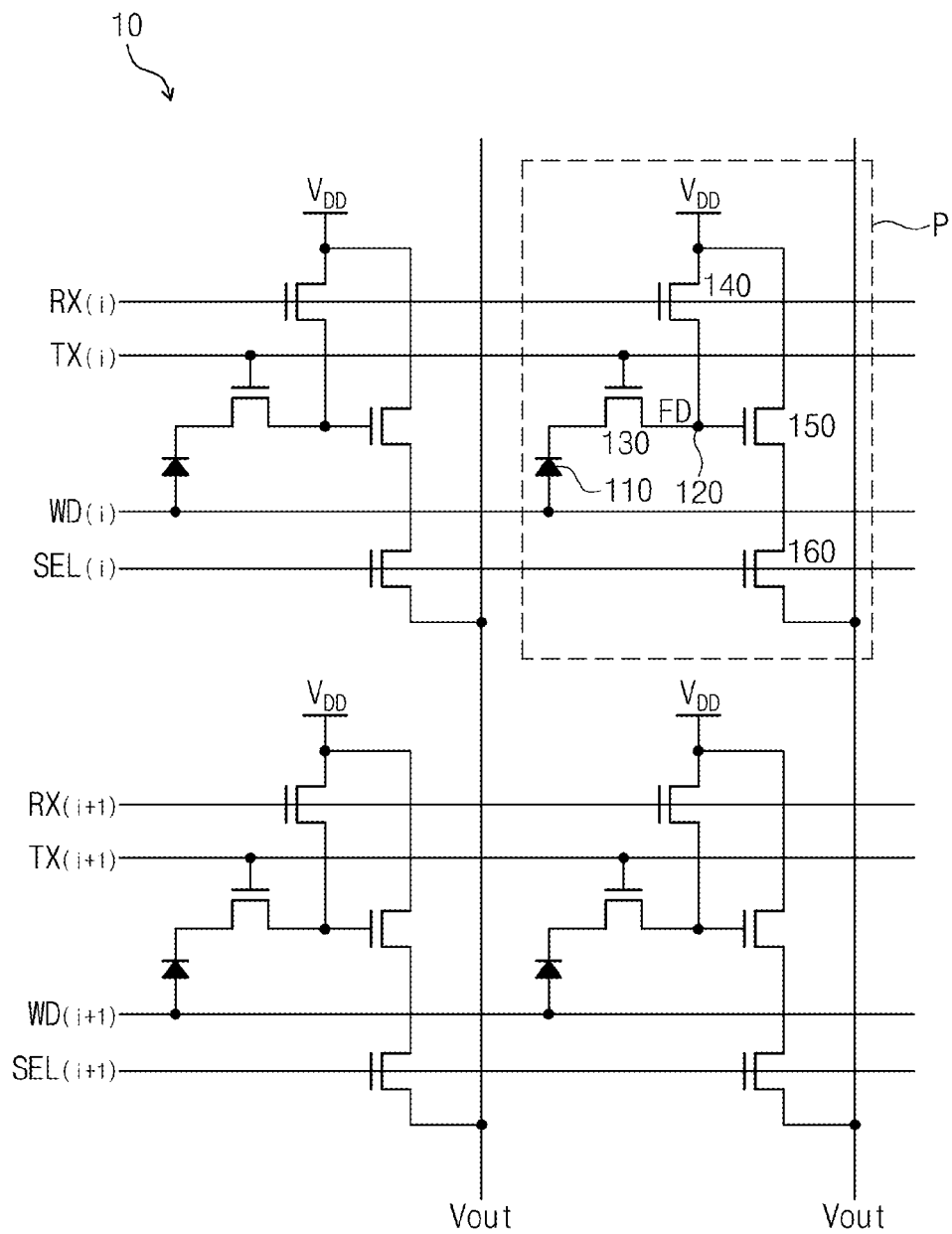
FIG. 1 is a circuit diagram of an active pixel sensor (APS) array of a CMOS image sensor according the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. The same applies to when an element of layer is referred to as being interposed "between" other element(s) and layer(s).

Furthermore, as used herein, the term "and/or" includes any and all practical combinations of one or more of the associated listed items.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

FIG. 1 illustrates a circuit of an active pixel sensor (APS) array 10 that may be employed by various embodiments and examples of CMOS image sensors according to the inventive concept.

The active pixel sensor (APS) array 10 includes an array (rows and columns) of unit pixels P, with each unit pixel P comprising a photo-electric converter 110 that generates electric charges from incident light and stores the electric charges, a detector 120, a charge-transmitter 130 that transfers the electric charges stored by the photo-electric converter to the detector 120 such that the detector 120 detects the electric charges generated by the photo-electric converter 110, and a reading device that reads an electric signal from the detector. The reading device may include a reset transistor 140, an amplifying transistor 150, and a select transistor 160.

The photo-electric converter 110 may comprise a photo diode, a photo transistor, a photo gate, a pinned photo diode (PPD), or any combination thereof. The detector 120 may be a floating diffusion (FD) region of a semiconductor device that receives electric charges from the photo-electric converter 110. The detector 120 in this example is electrically connected to the amplifying transistor 150 to control the amplifying transistor 150.

The reset transistor 140 resets the detector 120 periodically. To this end, a source of the reset transistor 140 is connected to the detector 120 and a drain of the reset transistor 140 is connected to a power voltage VDD. The reset transistor 140 may be operated by a bias voltage applied to a reset signal RX (i). For example, if the reset transistor 140 is in an ON state, the power voltage VDD is transmitted to the detector 120 through the reset transistor 140. Thus, a reset operation of the detector 120 can be controlled by the reset transistor 140.

The amplifying transistor 150, in conjunction with a constant current source (not shown) provided outside the unit pixel P, may serve as a source follower buffer amplifier amplifying a change in electric potential of the detector 120 and outputting the amplified signal to an output line $V_{out}$.

The selection transistor 160 operates to select a row of the unit pixels P. The selection transistor 160 may be operated by a bias applied to a row selection line SEL (i), and if the selection transistor 160 is in an ON state, the power voltage is transmitted to a drain of the selection transistor 160 through the amplifying transistor 150.

The active pixel sensor (APS) array 10 of this example also includes signal lines TX (i), RX (i), and SEL (i) for driving the charge-transfer device 130, the reset device 140, and the selection device 160. These signal lines extend horizontally in the direction of the rows of unit pixels P and thereby facilitate a simultaneous operation of the plurality of unit pixels of the row thereof.

Figure 2:
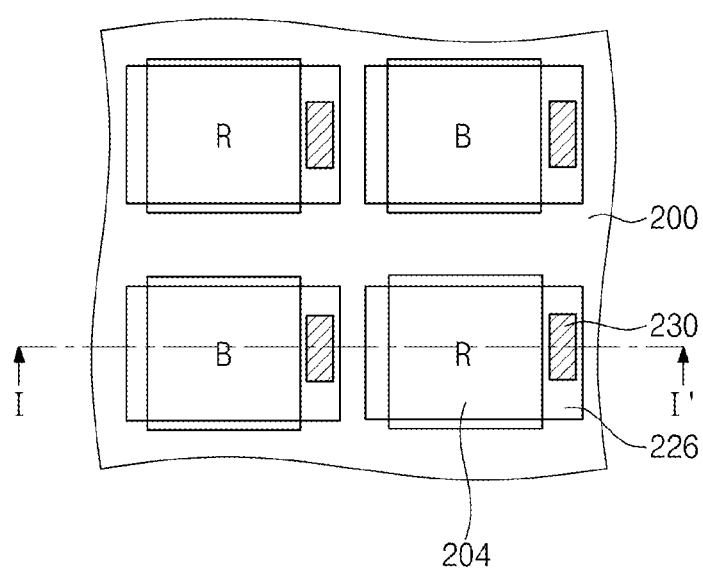
FIG. 2 is a plan view of the layout of a CMOS image sensor according to the inventive concept.

A first example of a CMOS image sensor, having a pixel array of the type shown in and described above with reference to FIG. 1, according to the inventive concept will now be described with reference to FIGS. 2 and 3.

The CMOS image sensor includes a semiconductor substrate 200 having a first pixel region P1 and a second pixel region P2, and a device isolation layer 202 in the semiconductor substrate 200 and defining the first and second pixel regions P1 and P2. The semiconductor substrate 200 may be a P-type of substrate. A respective photo-electric converter 204 is provided in each of the first and second pixel regions P1 and P2 of the semiconductor substrate 200. The photo-electric converter 204 may be a photodiode. In this case, the photo-electric converter 204 includes a first impurity region 204a and a second impurity region 204b. A depth of the first impurity region 204a may be greater than that of the second impurity region 204b, when measured from a top surface of the semiconductor substrate 200. The first and second impurity regions 204a and 204b may have conductivity types different from each other. For example, the first impurity region 204a may have an n-type conductivity, and the second impurity region 204b may have a p-type conductivity. Furthermore, the photo-electric converters 204 may be provided in pixels configured to detect red and blue light. For example, the first pixel region P1 may be configured to detect the red light, while the second pixel region P2 may be configured to detect the blue light.

In addition, the CMOS image sensor may have a respective storage node region 206 spaced apart from the photo-electric converters 204 in the first and second pixel regions P1 and P2 of the semiconductor substrate 200. The storage node region 206 may be a region doped with impurities, for example, n-type impurities. Also, the storage node region 206 may be a single doped region of the substrate 200 having a vertical cross-sectional area (in the direction of the rows of pixel units) smaller than that of the photo-electric converter 204.

An interlayer dielectric structure 210 may be provided on the semiconductor substrate 200. The interlayer dielectric structure 210 may include first to fifth interlayer insulating layers 211, 212, 213, 214, and 215 sequentially stacked on the semiconductor substrate 200. The interlayer dielectric structure 210 may further include at least one etch stop layer 216, each of which is provided on a respective one of the first to fifth interlayer insulating layers 211, 212, 213, 214, and 215. The fifth interlayer insulating layer 215 may be thicker than the first to fourth interlayer insulating layers 211, 212, 213, and 214.

Furthermore, the first to fifth interlayer insulating layers 211, 212, 213, 214, and 215 may be each formed of an oxide-based material. For example, the first to fifth interlayer insulating layers 211, 212, 213, 214, and 215 may comprise at least one oxide-based material selected from the group consisting of high density plasma (HDP) oxides, TEOS oxide, tonen silazene (TOSZ), spin on glass (SOG), undoped silica glass (USG), and high-k dielectrics. The etch stop layer 216 may include at least one of a silicon nitride layer and a silicon oxynitride layer.

In this example in which the interlayer dielectric structure 210 has the first to fifth interlayer insulating layers 211, 212, 213, 214, and 215, openings 220 are provided in the fifth interlayer insulating layer 215 on the first and second pixel regions P1 and P2, respectively. For example, as viewed in plan, the openings 220 overlap the photo-electric converters 204, respectively. The openings 220 are filled with color filters 222, respectively. For example, the opening 220 on the first pixel region P1 is filled with a red color filter allowing transmission of the red light, while the opening 220 on the second pixel region P2 is filled with a blue color filter allowing transmission of the blue light. Accordingly, only red light can be incident on the photo-electric converter 204 of the first pixel region P1, and only blue light can be incident on the photo-electric converter 204 of the second pixel region P2. An anti-reflecting layer 224 may be provided on surfaces delimiting the openings 220 to reduce reflection of the incident light. The anti-reflecting layer 224 may comprise SiON, SiC, SICN, or SiCO.

The CMOS image sensor of this example also has an interconnection structure 230 on each of the first and second pixel regions P1 and P2 of the semiconductor substrate 200. The elements of the interconnection structure 230 may be formed of metallic material, such as copper (Cu), aluminum (Al), and tungsten (W). These elements of the interconnection structure 230 include interlayer wires 231 and contact vias 233. The interlayer wires 231 may be provided on the first to fourth interlayer insulating layers 211, 212, 213, and 214, respectively, and the contact vias 233 may penetrate the first to fifth interlayer insulating layers 211, 212, 213, 214, and 215 and be connected to the interlayer wires 231, respectively. The contact vias 233 may include a lowermost contact via 233a, an intermediate contact via 233b, and an uppermost contact via 233c. In this case, the lowermost contact via 233a is connected to the storage node 206 by the first interlayer insulating layer 211.

Furthermore, in this embodiment, a buffer via 235 is provided between the lowermost contact via 233a and the storage node region 206.

In general, metal contact plugs would be the means used in the art to connect the interconnection structure 230 electrically to the storage node region 206. However, sufficient Ohmic contact between conventional metal contact plugs and the lightly-doped semiconductor substrate 200 would be difficult to achieve due to the presence of potential barrier at the interface therebetween. In an attempt to obviate this problem where the metal contact plugs connect the interconnection structure 230 to the storage node region 206, the storage node region 206 of the semiconductor substrate 200 could be heavily doped. However, the ion implantation process required to heavily dope the substrate 200 could damage of the semiconductor substrate 200 and lead to an abundance of dark electrons. In other words, the ion implantation would degrade the performance of the image sensor.

On the other hand, according to the inventive concept, the buffer via 235 provided between the interconnection structure 230 and the storage node region 206 makes it possible to prevent or suppress dark electrons from being generated in the image sensor. In this embodiment, the material of the buffer via 235 has a work-function between each of those of the metal contact plugs and the semiconductor substrate 200 (e.g., silicon) and thereby lowers the potential barrier between the semiconductor substrate 200 and the interconnection structure 230. As a result, it is possible to realize good Ohmic contact between the semiconductor substrate 200 and the interconnection structure 230.

For example, the semiconductor substrate 200 may be formed of a material (e.g., silicon) having a work-function of 4.05eV and the interconnection structure 230 may formed of metallic material (e.g., copper) having a work-function of 4.70eV. And, the buffer via 235 may be formed of carbon nanotube whose work-function is lower than that of the interconnection structure 230. Alternatively, the buffer via 235 may be formed of organic-inorganic hybrid material or conductive polymer. Accordingly, electrons or holes are more readily transferred from or to the storage node region 206 through the interconnection structure 230 than if the silicon of the substrate and the metal of the interconnection structure contacted each other. Accordingly, the inventive concept can enhance the performance of a CMOS image sensor.

Furthermore, in the illustrated example of this embodiment, a respective first transparent electrode 226 is provided on each color filter 222. The uppermost contact via 233c penetrates the fourth and fifth interlayer insulating layers 214 and 215 and contacts a first transparent electrode 226. Therefore, the first transparent electrode 226 and the storage node region 206 are electrically connected to each other by the interconnection structure 230.

The CMOS image sensor may also have an organic photo-electric layer 227 on the first transparent electrodes 226. The organic photo-electric layer 227 is of an organic material that generates electron-hole pairs when irradiated with light of wavelengths within a specific range. For example, the organic photo-electric layer 227 generates electron-hole pairs only when irradiated by green light. The electrons stored or accumulated in the layer 227 as a result are transferred to the storage node region 206 through the first transparent electrode 226 and the interconnection structure 230.

A second transparent electrode 228 may be provided on the organic photo-electric layer 227. In an example of this embodiment, the first and second transparent electrodes 226 and 228 are of the same material. For example, the first and second transparent electrodes 226, 228 are of at least one material selected from the group consisting of ITO, IZO, ZnO, $SnO_2$, ATO (antimony-doped tin oxide), AZO (Al-doped zinc oxide), GZO (gallium-doped zinc oxide), $TiO_2$, and FTO (fluorine-doped tin oxide).

The CMOS image sensor may also have micro-lenses 229 disposed on the second transparent electrode 228 and facing the first and second pixel regions P1 and P2, respectively. Each micro-lens 229 is configured to focus a fraction of the incident light onto a photo-electric converter 204.

A second embodiment of a CMOS image sensor according to the inventive concept will now be described in detail with reference to FIG. 4. However, for the sake of brevity, select elements which are similar to elements already described in connection with the previous embodiment, and designated by like reference numerals, will not be described in detail again.

Figure 4:
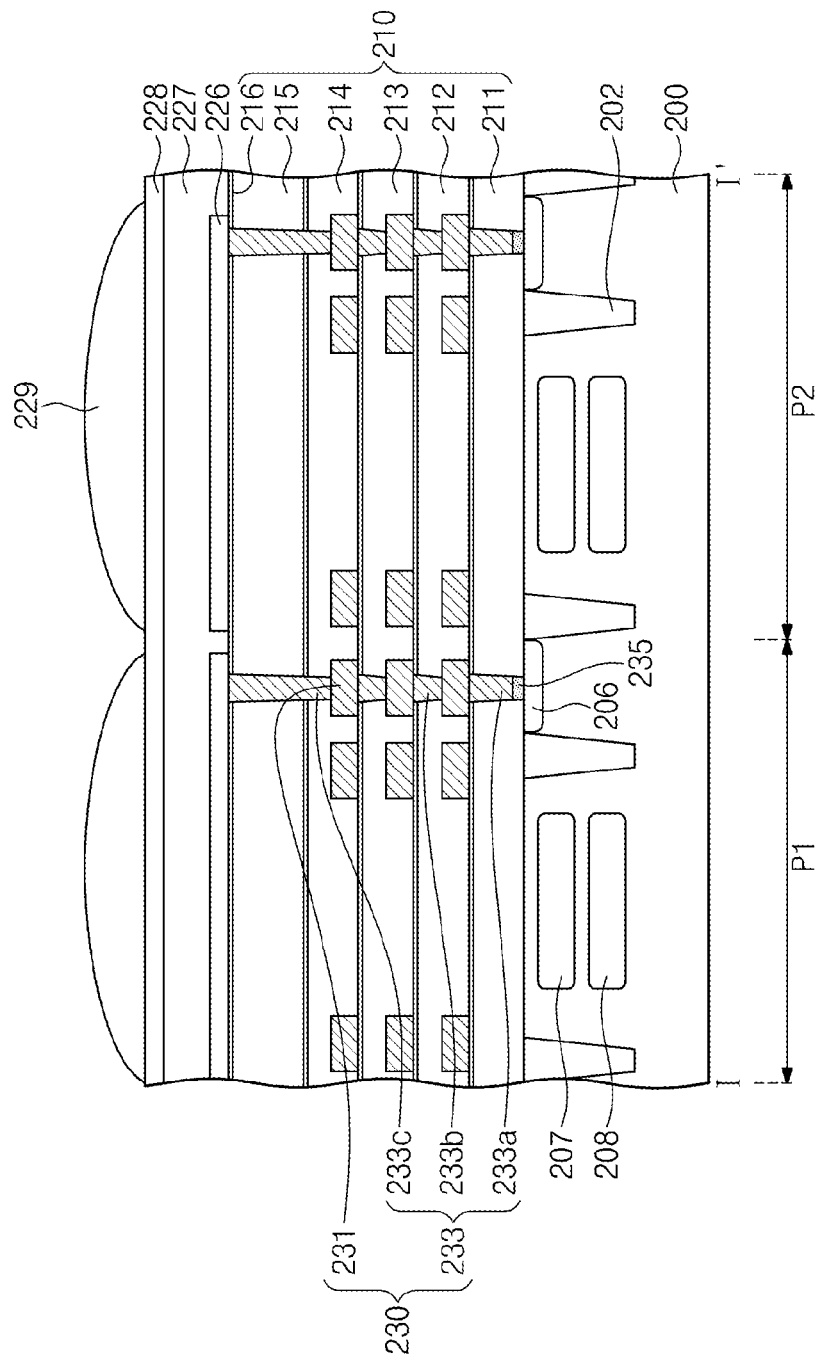
FIG. 4 is a sectional view of a second example of a CMOS image sensor according to the inventive concept, in a direction corresponding to that of line I-I' of FIG. 2.

Referring to FIG. 4, a first n-type doped region 207 and a second n-type doped region 208 are provided in each of the first and second pixel regions P1 and P2 of the semiconductor substrate 200. The first and second n-type doped regions 207 and 208 are provided spaced apart from each other and from the top surface of the semiconductor substrate 200, in a vertical direction. In other words, the depth to which the second n-type doped region 208 extends is greater than that to which the first n-type doped region 207 extends, when measured from the top surface of the semiconductor substrate 200. These "depths" are designed for based on the distance that light of various wavelengths can propagate through the semiconductor substrate 200 from its upper surface. In an example of this embodiment, light of a relatively short wavelength (e.g., blue light) can propagate merely to and be incident on the first n-type doped region 207, and light of a relatively long wavelength (e.g., red light) can propagate to and be incident on the second n-type doped region 208. For this reason, the first n-type doped region 207 may serve as a blue photo-electric converter (B-PD) detecting blue light, while the second n-type doped region 208 may serve as a red photo-electric converter (R-PD) detecting red light. The first and second n-type doped regions 207 and 208 are connected to different floating diffusion (FD) regions.

Figure 3:
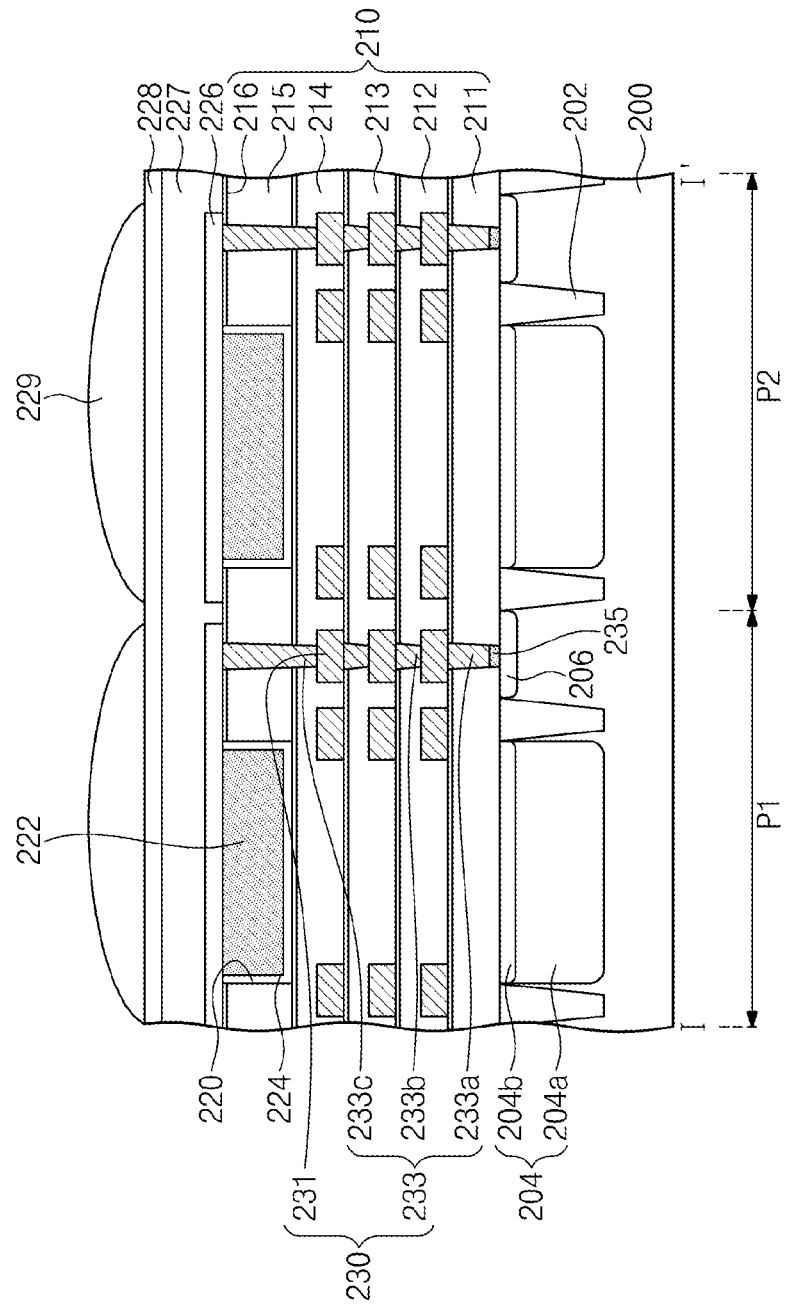
FIG. 3 is a sectional view of a first example of a CMOS image sensor according to the inventive concept, in a direction corresponding to that of line I-I' of FIG. 2.

And so, unlike the CMOS image sensor of FIG. 3, color filters are not provided on the first and second pixel regions P1 and P2. Rather, in an example of the present embodiment, an organic photo-electric layer 227 is used to detect the green light, while the first and second n-type doped regions 207 and 208 are used detect the blue and red light, respectively.

Further embodiments of a CMOS image sensor according to the inventive concept will be described in detail with reference to FIGS. 5 through 7. Again, for the sake of brevity, select elements which are similar to those already described in connection with the first embodiment, and designated by like reference numerals, will not be described again in further detail.

Figure 5:
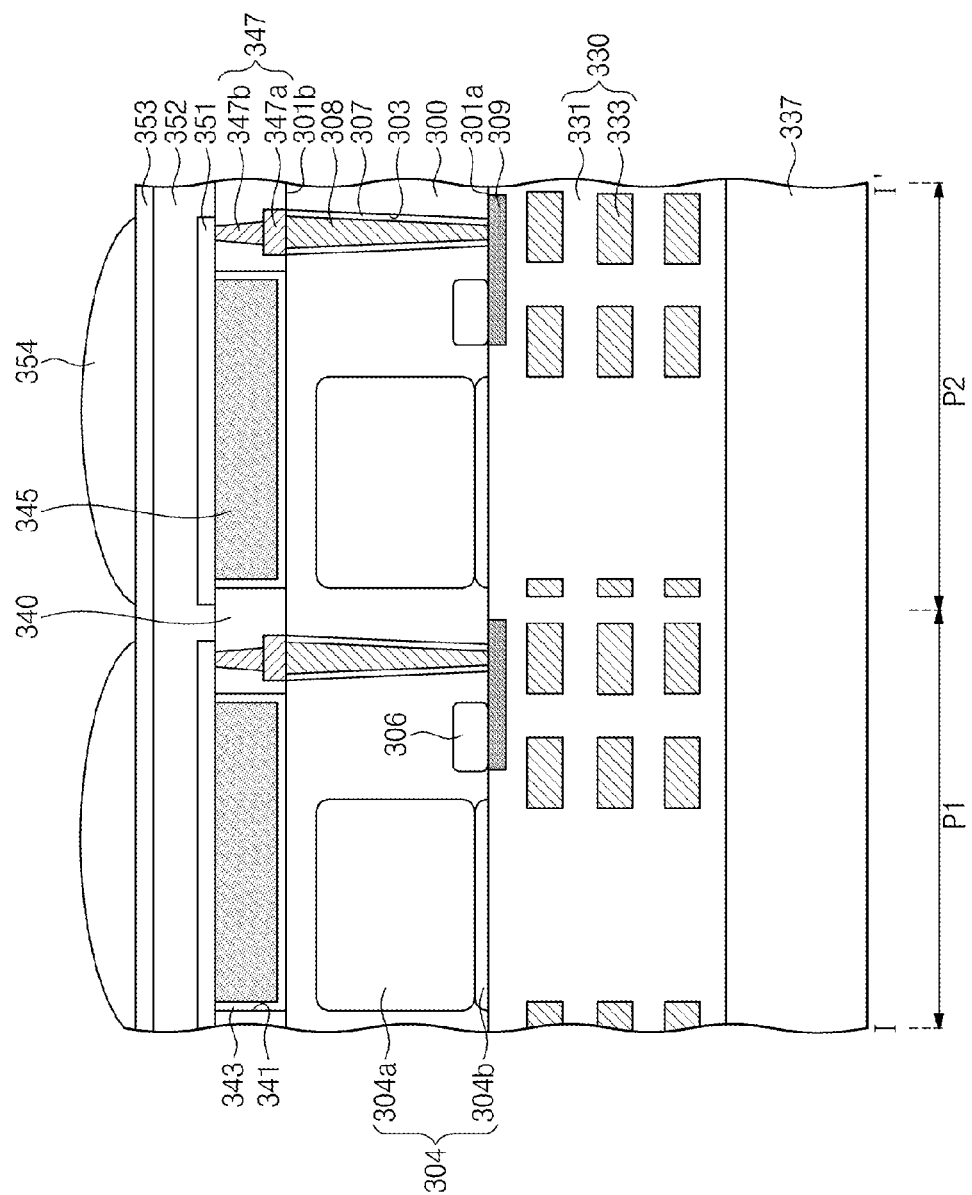
FIG. 5 is a sectional view of a third example of a CMOS image sensor according to the inventive concept, taken a direction corresponding to that of line I-I' of FIG. 2 to illustrate.

Referring to FIG. 5, semiconductor substrate 300 has a first surface 301a and a second surface 301b opposite each other. The first surface 301a may be the top surface of the semiconductor substrate 300, while the second surface 301b may be the bottom surface of the semiconductor substrate 300. The semiconductor substrate 300 may be a p-doped silicon wafer. Alternatively, the semiconductor substrate 300 may be an epitaxial substrate including a p-type silicon wafer and an epitaxial layer thereon.

A photo-electric converter 304 is provided in the semiconductor substrate 300. The photo-electric converter 304 may extend deeply into the semiconductor substrate from the first surface 301a. For example, the photo-electric converter 304 may include a first impurity region 304a extending deeply into the semiconductor substrate 300 from a location adjacent to the first surface 301a, and second shallower impurity region 304b extending in the semiconductor substrate 300 from the first surface 301a. In this case, the first impurity region 304a and the second impurity region 304b are of different conductivity types. For example, the first impurity region 304a may be a doped region having an n-type conductivity, whereas the second impurity region 304b may be a doped region having a p-type conductivity.

The CMOS image sensor of FIG. 5 also has a storage node region 306 in each of the first and second region P1 and P2 of the semiconductor substrate 300. The storage node region 306 may be spaced apart from the photo-electric converter 304 and contact the first surface 301a of the semiconductor substrate 300. In this example, the storage node region 306 is a region doped with n-type impurities so as to have an n-type conductivity.

Through-holes 303 extend through the semiconductor substrate 300 to locations adjacent the storage node regions 306, respectively. A width of the through-hole 303 may gradually increase in a vertical direction away from the first surface 301a of the semiconductor substrate 300. In other words, the portion of the through-hole 303 near the first surface 301a may be narrower than the portion of the through-hole 303 near the second surface 301b. An insulating layer 307 may be formed along the sides of the through-hole 303. The insulating layer 307 may be formed of an oxide- or nitride-based material. The through-hole 303 with the insulating layer 307 may be filled with a first contact via 308. The first contact via 308 may be in contact with the insulating layer 307. The first contact via 308 may be formed of or include a metallic material, such as copper (Cu), aluminum (Al), or tungsten (W).

The CMOS image sensor also has a buffer 309 on the first surface 301a of the semiconductor substrate 300. In this case, the buffer 309 is an electrode that contacts the storage node region 306 and the first contact via 308. Accordingly, the first contact via 308 and the storage node region 306 are electrically connected to each other through the buffer 309. The buffer 309 may comprise a carbon nanotube, i.e., may comprise a carbon nanotube electrode.

The CMOS image sensor also has an interconnection structure 330 on the first surface 301a of the semiconductor substrate 300. The interconnection structure 330 includes a front-side interlayer insulating layer 331 and a plurality of front-side wires 333. A supporting layer 337 may be disposed on and attached to the interconnection structure 330. Due to the presence of the supporting layer 337, the semiconductor substrate 300 can be handled while remaining highly stable, even when the semiconductor substrate 300 has been thinned by a back-side polishing process. The supporting layer 337 may be a silicon oxide layer.

In the illustrated example, a back-side interlayer insulating layer 340 is provided on the second surface 301b of the semiconductor substrate 300. The back-side interlayer insulating layer 340 has openings 341 exposing the second surface 301b of the semiconductor substrate 300. The openings 341 overlap the photo-electric converters 304, respectively, as viewed in plan. Each opening 341 may be conformally covered with an anti-reflecting layer 343, and the opening 341 with the anti-reflecting layer 343 may be filled with a color filter 345. A respective second contact via 347, extending through the back-side interlayer insulating layer 340, is electrically connected to each first contact via 308. In an example of this embodiment, the second contact via 347 includes a back-side wire 347a in contact with the first contact via 308 and a metal via 347b connecting the back-side wire 347a with a first transparent electrode 351 provided on the color filter 345. The second contact via 347 may be formed of the same metallic material as the first contact via 208.

An organic photo-electric layer 352 and a second transparent electrode 353 may be disposed in the foregoing sequence on the first transparent electrode 351. A micro-lens 354 may be provided on the second transparent electrode 353 to face the color filter 345.

Figure 6:
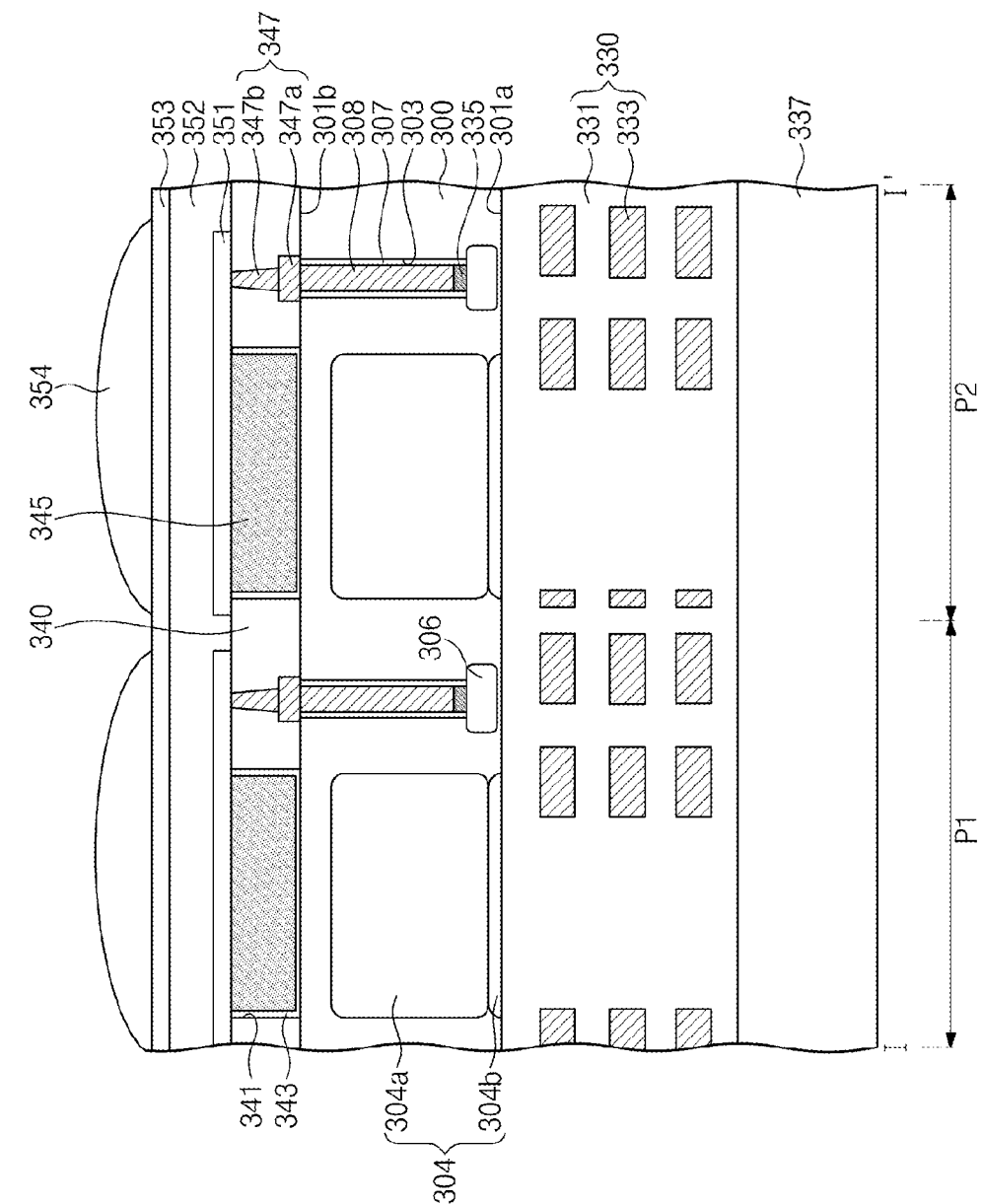
FIG. 6 is a sectional view of a fourth example of a CMOS image sensor according to the inventive concept, taken a direction corresponding to that of line I-I' of FIG. 2 to illustrate.

In the CMOS image sensor of FIG. 6, through-hole 303 extends through the semiconductor substrate 300 to the storage node region 306. A buffer 335 in the form of a via disposed in the through-hole 303 is interposed between the first contact via 308 and the storage node region 306.

Figure 7:
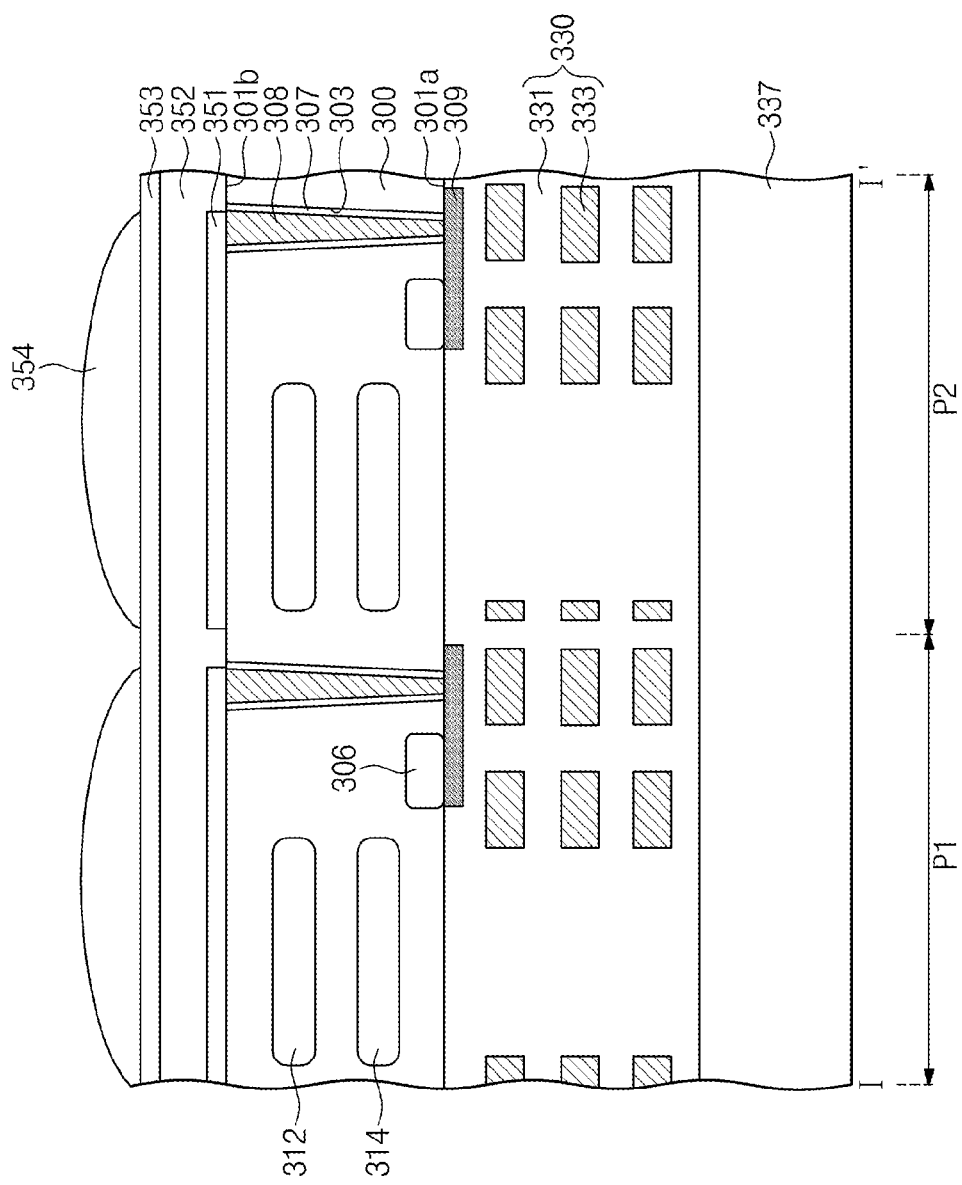
FIG. 7 is a sectional view of a fifth example of a CMOS image sensor according to the inventive concept, taken a direction corresponding to that of line I-I' of FIG. 2 to illustrate.

In the CMOS image sensor of FIG. 7, a first n-type doped region 312 and a second n-type doped region 314 are provided in each of the first and second pixel regions P1 and P2 of the semiconductor substrate 300. The first and second n-type doped regions 312 and 314 may be spaced apart from each other and from the first surface 301a of the semiconductor substrate 300, in a vertical direction. A depth to which the first n-type doped region 312 extends is greater than that to which the second n-type doped region 314 extends, as measured from the first surface 301a of the semiconductor substrate 300. In this embodiment, with respect to light incident on the second surface 301b of the semiconductor substrate 300, if the light has a relatively short wavelength (e.g., of blue) it will propagate to the first n-type doped region 312, and if the light has a longer wavelength (e.g., of red), it will propagate to the second n-type doped region 304. In this respect, the first and second n-type doped regions 312 and 314 provide photo-electric converters in the regions P1 and P2.

Also, in this example, first transparent electrodes 351 are provided on the second surface 301b of the semiconductor substrate 300. The first transparent electrodes 351 may cover the photo-electric converters 312 and 314 and may contact the first contact vias 308. The organic photo-electric layer 352 and the second transparent electrode 353 may be provided on the first transparent electrode 351.

FIGS. 8A through 8D illustrate a method of fabricating the CMOS image sensor of FIG. 5.

Figure 8A:
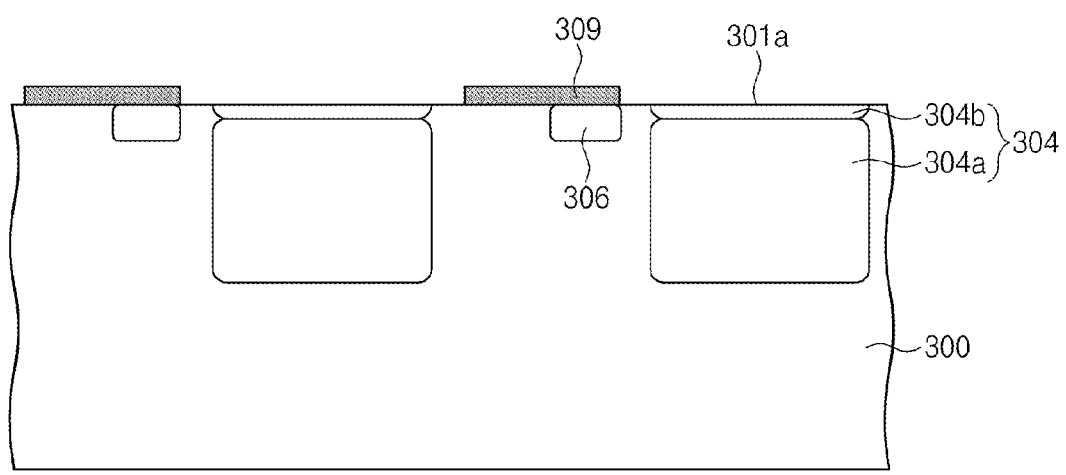
FIGS. 8A, 8B, 8C and 8D illustrate a method of fabricating the CMOS image sensor of FIG. 5 and are each a sectional view of the sensor during the course of its manufacture.

Referring to FIG. 8A, ion implantation processes are carried out to implant ions into the semiconductor substrate 300 to form the photo-electric converter 304 and the storage node region 306. The semiconductor substrate 300 may be a p-type of substrate. The ion implantation processes may be performed at the first surface 301a of the semiconductor substrate 300.

The buffer 309 is formed on the first surface 301a of the semiconductor substrate 300. The buffer 309 may be formed through sequential deposition and etching processes. In an example of this method, the buffer 309 is formed by forming a layer of carbon nanotubes by CVD, and etching the layer to form a carbon nanotube elecrode.

Figure 8B:
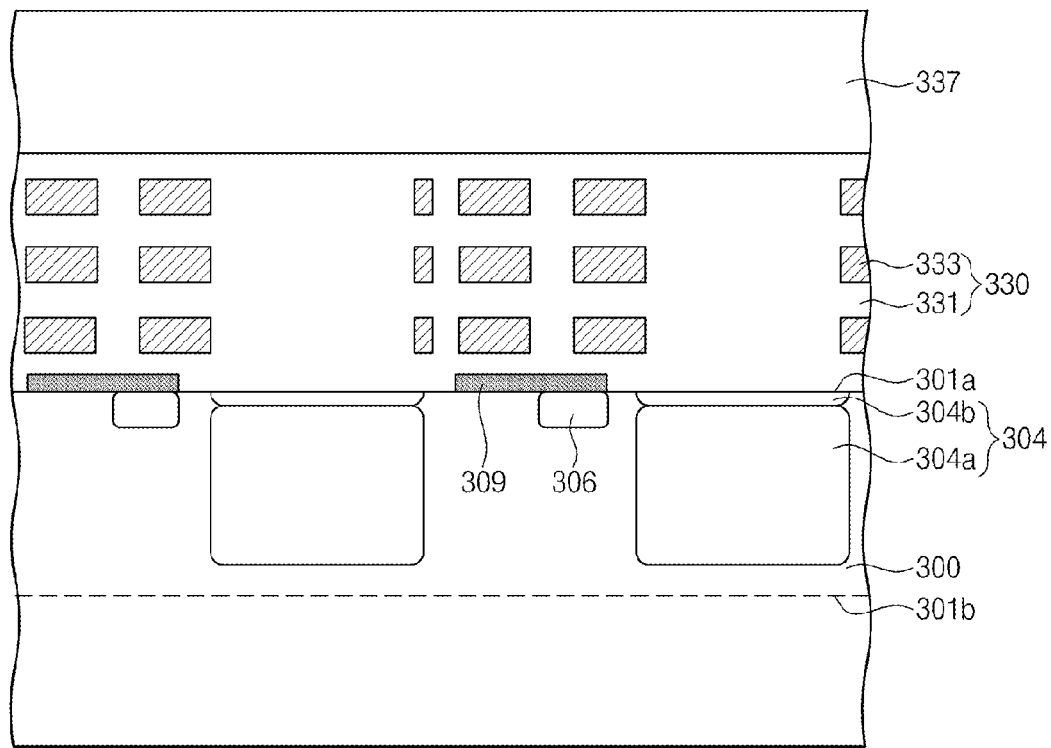

Referring to FIG. 8B, the interconnection structure 330 is then formed on the first surface 301a of the semiconductor substrate 300.

Also, the supporting layer 337 is attached to the interconnection structure 330. In this respect, the supporting layer 337 may be directly attached to the interconnection structure 330 using a plasma or thermal treatment process. Alternatively, the supporting layer 337 may be attached to the interconnection structure 330 with an adhesive layer interposed therebetween.

The second surface 301b of the semiconductor substrate 300 may be polished after the supporting layer 337 has been attached to remove a portion of the semiconductor substrate 300 and thereby reduce the thickness of the structure. The polishing process may be terminated before the photo-electric converter 304 is exposed. The polishing process may be a mechanical grinding process, a chemical mechanical polishing process, an etch-back process, or a wet etching process.

Figure 8C:
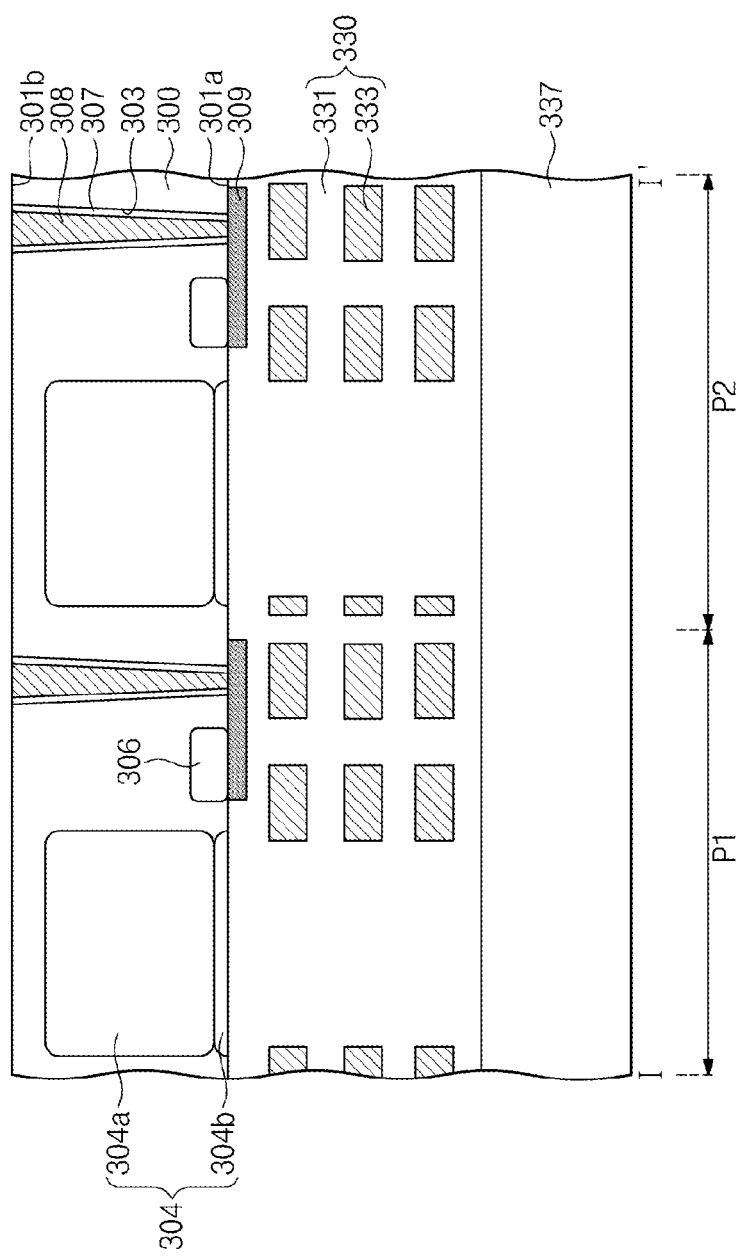

Referring to FIG. 8C, after the polishing process has been performed, the semiconductor substrate 300 is turned over such the second surface 301b is positioned above the supporting layer 337. Each through-hole 303 is then formed in the semiconductor substrate 300 to expose a portion of the buffer 309. Insulating layer 307 may then be formed along the sides of the through-hole 303. The insulating layer 307 may be formed of an oxide- or nitride-based material. The through-holes 303 are then filled to form the first contact vias 308 which, in this example, contact the buffer 309. The first contact vias 308 may be formed of or include a metallic material, such as copper (Cu), aluminum (Al), or tungsten (W).

Figure 8D:
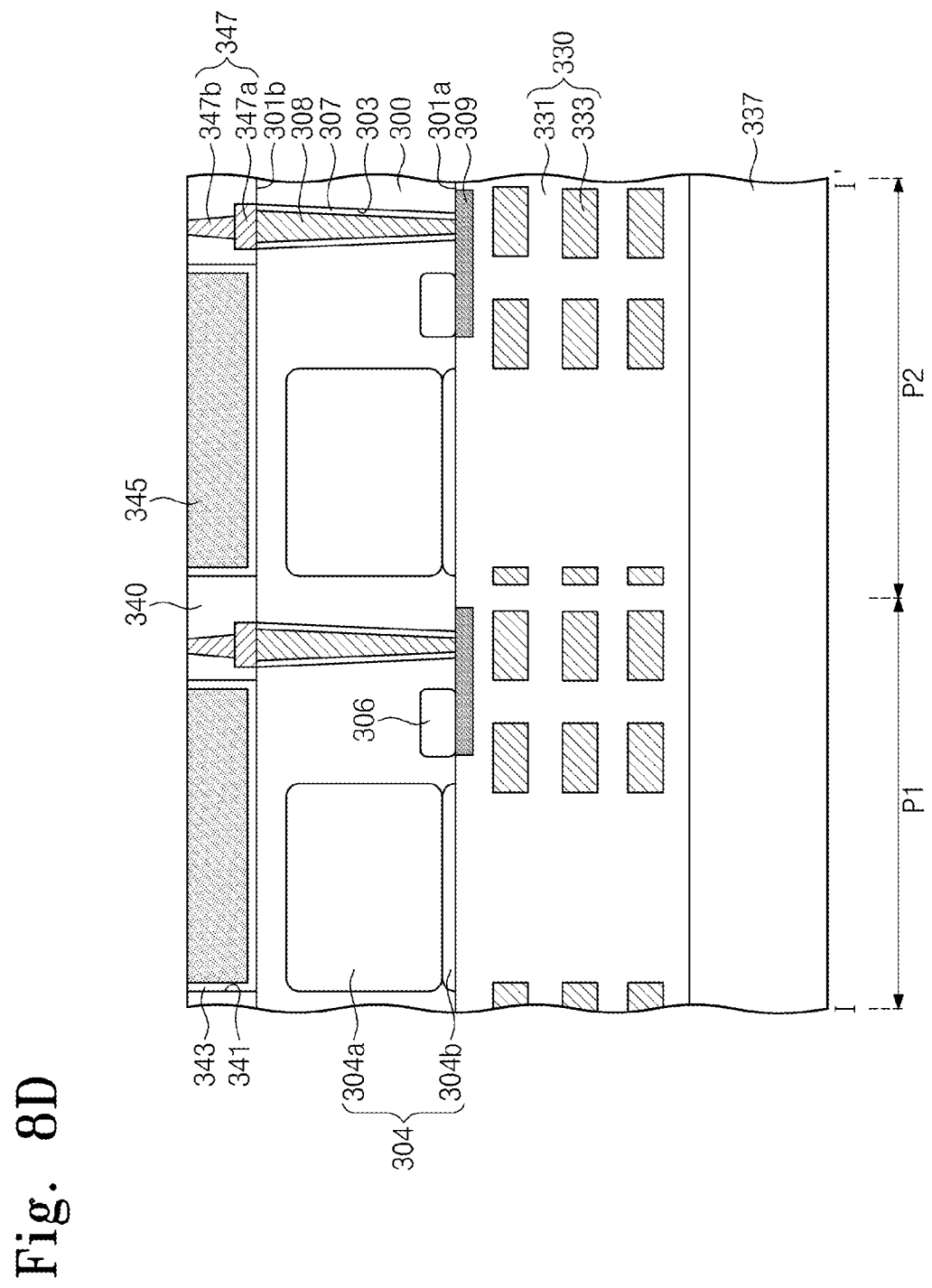

Referring to FIG. 8D, in this example, the back-side wire 347a is then formed on the second surface 301b of the semiconductor substrate 300. The back-side wire 347a may be formed directly on the first contact via 308. The back-side interlayer insulating layer 340 is then formed on the second surface 301b of the semiconductor substrate 300 to cover the back-side wire 347a. Opening 341 is formed in the back-side interlayer insulating layer 340 to expose the second surface 301b of the semiconductor substrate 300. The opening 341 may be formed by patterning or recessing the back-side interlayer insulating layer 340. The opening 341 may be formed such that at least part of the opening 341 lies directly over the photo-electric converter 304. Next, anti-reflecting layer 343 may be formed to cover the surfaces defining the opening 341. The anti-reflecting layer 343 may consist of a silicon nitride layer or a silicon oxide layer or comprise at least one of a silicon nitride layer and a silicon oxide layer.

The color filters 345 are then formed on the anti-reflecting layer 343 to fill the openings 341. Each color filter 345 may be formed of a material capable of providing light of a particular color (e.g., red or blue) to the corresponding pixel region. To this end, the color filters 345 provided on the first and second pixel regions P1 and P2 may include different dyes or coloring agents.

Furthermore, the metal vias 347b may be formed in the back-side interlayer insulating layer 340 and so as to contact the back-side wires 347a, respectively.

Next, referring back to FIG. 5, the first transparent electrode 351 is formed on the back-side interlayer insulating layer 340 to be in contact with the color filters 345 and the metal vias 347b. The organic photo-electric layer 352 and the second transparent electrode 353 are sequentially formed over the first transparent electrode 351. The first transparent electrode 351 and the second transparent electrode 353 may be formed of substantially the same material. The microlenses 354 are then formed on the second transparent electrode 353 in such a way that each of them overlaps a corresponding one of the photo-electric converters 304, as viewed in plan.

As will be clear to those of ordinary skill in the art, the method of fabricating a CMOS image sensor of FIG. 5, as shown in and described above with reference to FIGS. 8A through 8D, can be readily adapted to fabricate the other embodiments and examples of CMOS image sensors shown in and described with reference to FIGS. 2-4, 6 and 7.

Figure 9:
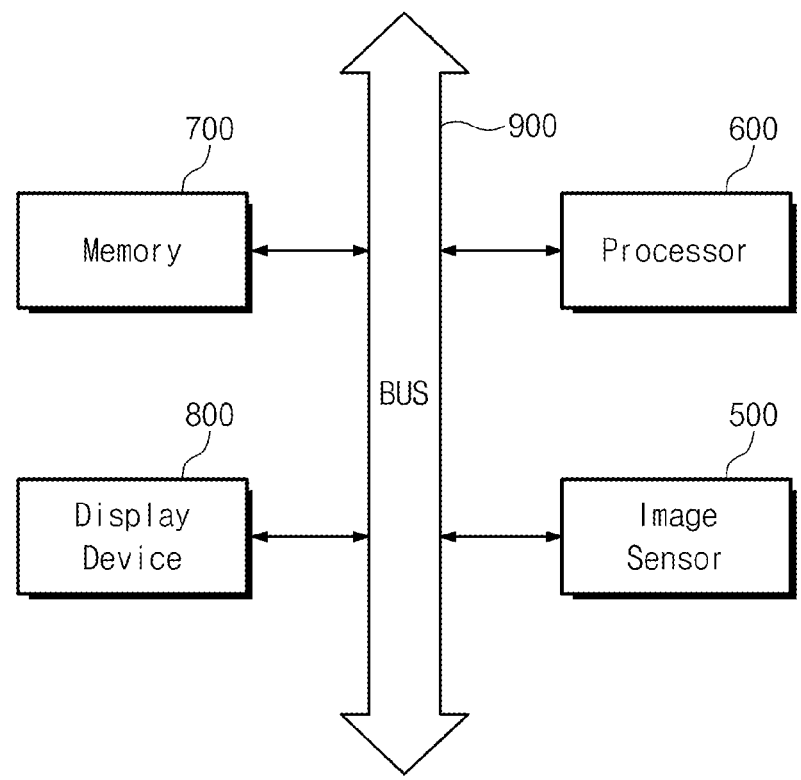
FIG. 9 is a block diagram of an example of an electronic device including an image sensor, according to the inventive concept.
Figure 10:
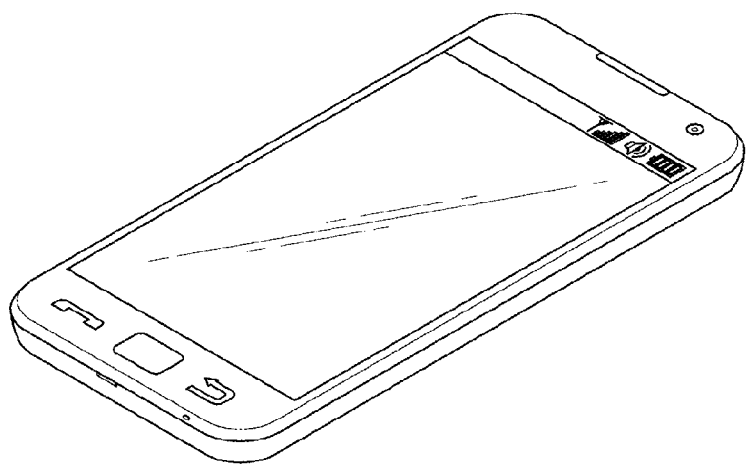
FIGS. 10, 11, 12, 13 and 14 are perspective views of examples of multimedia devices including an image sensor according to the inventive concept.
Figure 11:
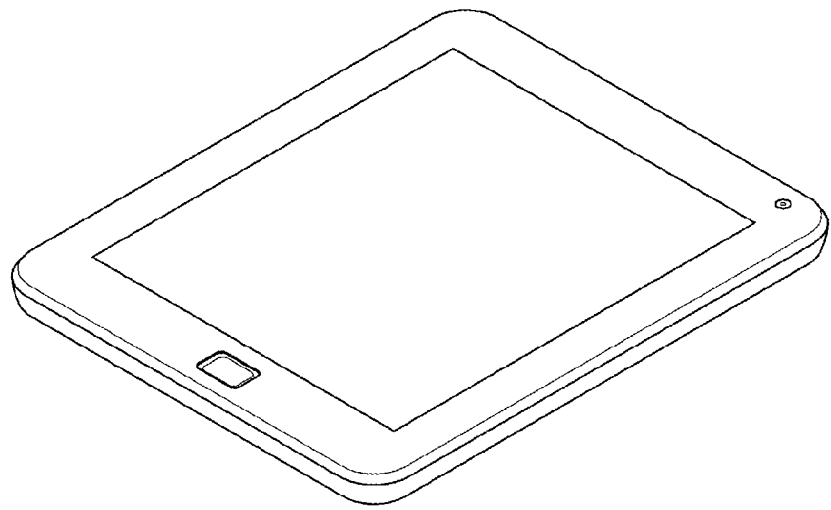
Figure 12:
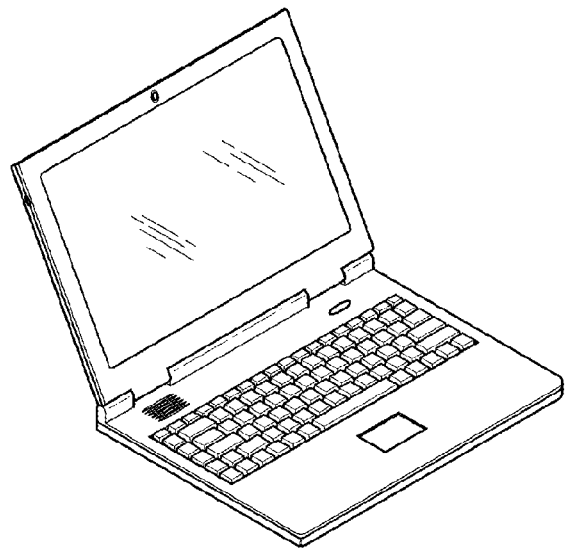
Figure 13:
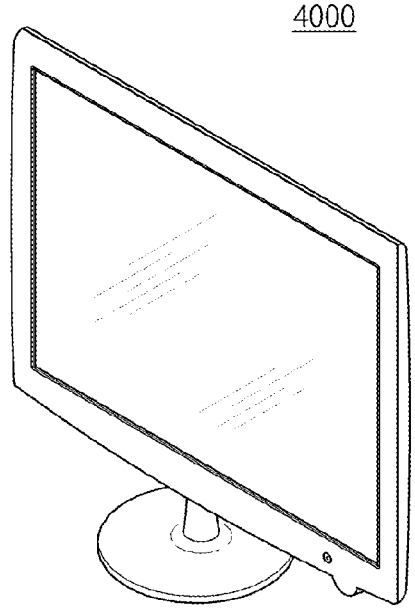
Figure 14:
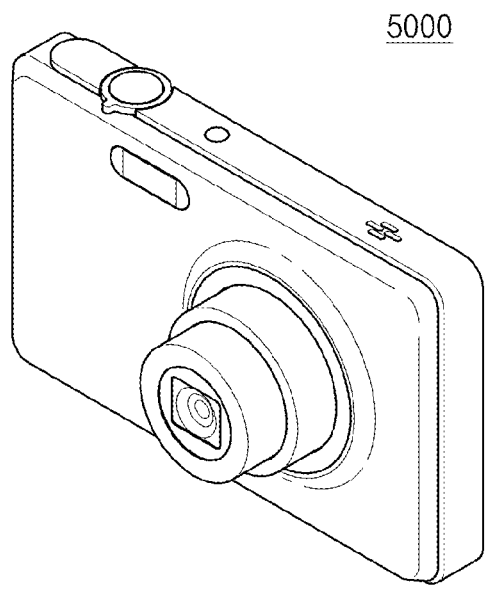

An electronic device having a CMOS image sensor, according to the inventive concept, will now be described with reference to FIG. 9.

The electronic device may be any type of device employing an electronic image sensor, such as a digital camera or a mobile device. Referring to FIG. 9, the electronic device of this example includes an image sensor 500, a processor 600, a memory 700, a display 800, and a bus 900. The image sensor 500 captures an external image under control of the processor 600, and provides the corresponding image data to the processor 600 through the bus 900. The processor 600 may store the image data in the memory 700 through the bus 900. The processor 600 may also output the image data stored in the memory 700, e.g., for display on the display 800.

FIGS. 10 through 14 show examples of multimedia devices, which may employ image sensors according to the inventive concept.

Image sensors according to example embodiments of the inventive concept can be employed by a variety of multimedia devices with an imaging function. For example, image sensors according to the inventive concept may be employed by a mobile phone or a smart phone 1000 as exemplarily shown in FIG. 10, to a tablet PC or a smart tablet PC 2000 as exemplarily shown in FIG. 11, to a laptop computer 3000 as exemplarily shown in FIG. 12, to a television set or a smart television set 4000 as exemplarily shown in FIG. 13, and to a digital camera or a digital camcorder 5000 as exemplarily shown in FIG. 14.

Figure 15:
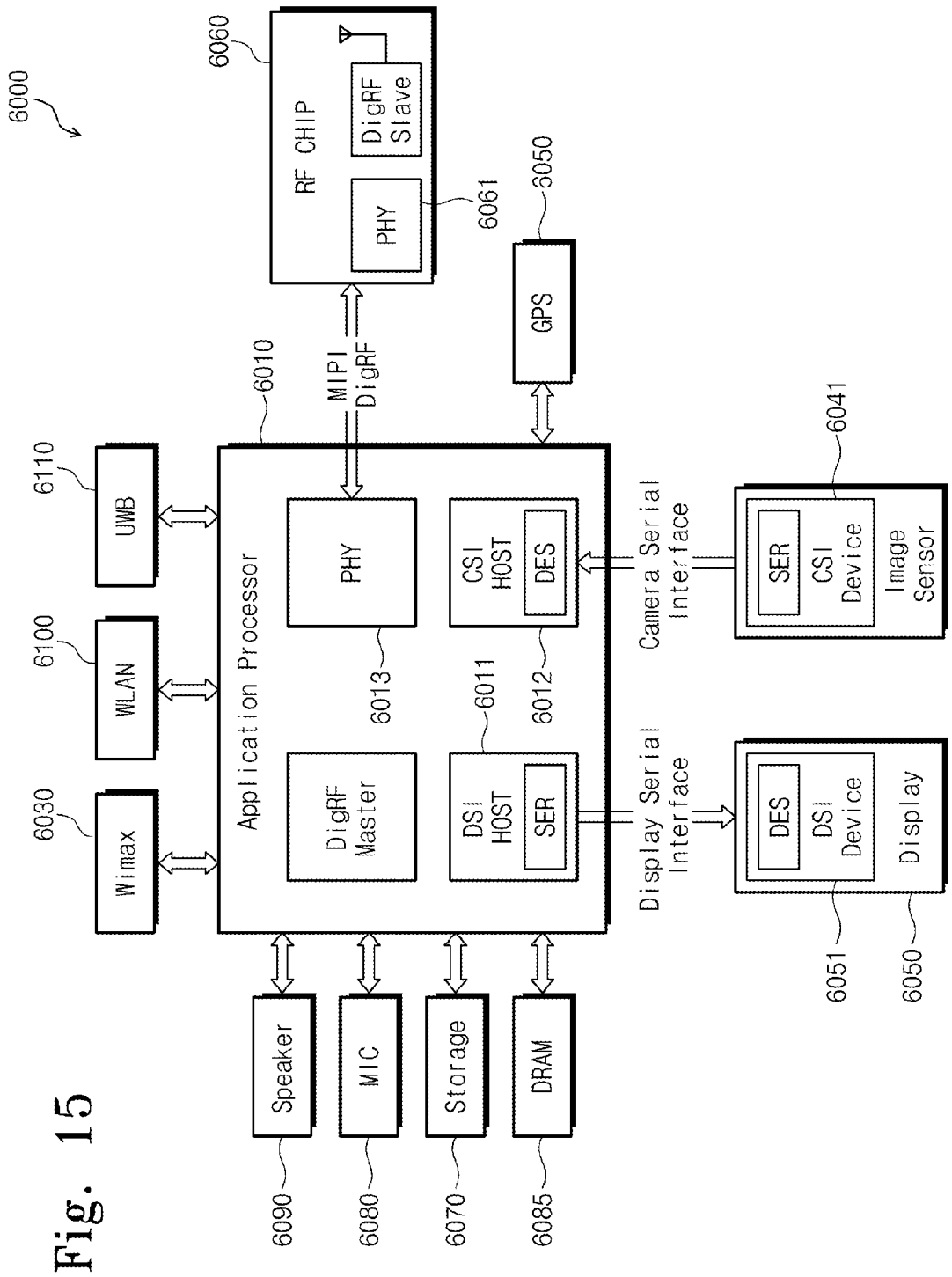
FIG. 15 is a block diagram of an example of an image processing system including an image sensor, according the inventive concept.

FIG. 15 shows an image processing system 600 including an image sensor according to the inventive concept. The image processing system 6000 may be a data processing device (e.g., a personal digital assistants (PDA), a portable multimedia player (PMP), an internet protocol television (IPTV), or a smart phone), which may be configured to utilize or support the MIPI® (mobile industry processor interface).

The image processing system 6000 includes a CMOS image sensor according to the inventive concept (and including an APS array 10 shown in and described with reference to FIG. 1), an application processor (AP) 6010, and a display 6050.

A camera serial interface (CSI) host 6012 of the application processor 6010 may communicate in a serial manner with a CSI device 6041 of the image sensor through a camera serial interface.

Here, for example, the CSI host 6012 may include a deserializer DES and the CSI device 6041 may include a serializer SER.

A display serial interface (DSI) host 6011 of the application processor 6010 may communicate in a serial manner with a DSI device 6051 of the display 6050 through a display serial interface.

Here, for example, the DSI host 6011 may include a serializer SER and the DSI device 6051 may include a deserializer DES.

In an example of this embodiment, the image processing system 6000 further includes a RF chip 6060, configured to communicate with the application processor 6010.

Physical layers (PHY) 6013 and 6061, which are contained in the application processor 6010 and the RF chip 6060, respectively, may exchange data by a MIPI DigRF.

Still further, in an example of this embodiment, the image processing system 6000 also includes a GPS receiver 6020, a storage 6070, a microphone (MIC) 6080, a dynamic random access memory (DRAM) 6085, and a speaker 6090.

The image processing system 6000 may communicate using a world interoperability for microwave access (Wimax) module 6030, a wireless LAN (WLAN) module 6100, and an ultra wideband (UWB) module 6110, etc.

According to the inventive concept as described above, a CMOS image sensor includes a buffer interposed between a contact and a storage node region of a semiconductor substrate. Due to the presence of the buffer, the potential barrier between the contact and the semiconductor substrate is lowered and thus, the CMOS image sensor exhibits an improved ohmic contact property as between the contact and storage node region.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. An image sensor, comprising:
   a semiconductor substrate having a major first surface and a major second surface facing in opposite directions, and a contact hole extending vertically in a direction from one the first surface towards the second surface;
   a photo-electric converter in the semiconductor substrate;
   a storage node region spaced apart from the photo-electric converter and located in the semiconductor substrate adjacent to the first surface;
   an interconnection structure disposed on the first surface of the semiconductor substrate;
   a via contact in the contact hole of the semiconductor substrate;
   an organic photo-electric layer on the semiconductor substrate; and
   a buffer interposed between the storage node region and the via contact and electrically connecting the storage node region to the via contact,
   wherein the contact hole is spaced laterally from the storage node region,
   wherein the storage node region has a surface that is exposed at the first surface of the semiconductor substrate, interfaces with an upper surface of the buffer, and is coplanar with a lower surface of the via contact.

2. The image sensor of claim 1, wherein the buffer comprises a carbon nanotube.

3. The image sensor of claim 1, wherein a width of the contact hole is greater nearer to the second surface of the semiconductor substrate than to the first surface of the semiconductor substrate.

4. The image sensor of claim 1, further comprising an insulating layer interposed between the semiconductor substrate and the organic photo-electric layer.

* * * * *